(12) United States Patent
Chang et al.

(10) Patent No.: US 7,507,915 B2
(45) Date of Patent: Mar. 24, 2009

(54) STACK STRUCTURE OF CARRIER BOARDS EMBEDDED WITH SEMICONDUCTOR COMPONENTS AND METHOD FOR FABRICATING THE SAME

(75) Inventors: Chia-Wei Chang, Hsin-chu (TW);
Lin-Yin Wong, Hsin-chu (TW);
Zao-Kuo Lai, Hsin-chu (TW);
Chung-Cheng Lien, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 183 days.

(21) Appl. No.: 11/462,604

(22) Filed: Aug. 4, 2006

(65) Prior Publication Data
US 2007/0084628 A1    Apr. 19, 2007

(30) Foreign Application Priority Data
Oct. 18, 2005    (TW) .............................. 94136264 A

(51) Int. Cl.
*H05K 1/16*    (2006.01)

(52) U.S. Cl. ...................................... 174/260; 174/262

(58) Field of Classification Search ................. 174/260, 174/261, 262
See application file for complete search history.

(56) References Cited

U.S. PATENT DOCUMENTS

| | | | |
|---|---|---|---|
| 6,759,272 B2 * | 7/2004 | Tsubosaki et al. | 438/109 |
| 6,798,049 B1 | 9/2004 | Shin et al. | |
| 6,849,949 B1 * | 2/2005 | Lyu et al. | 257/777 |
| 7,259,450 B2 * | 8/2007 | Wood et al. | 257/685 |

* cited by examiner

*Primary Examiner*—Ishwar (I. B.) Patel
(74) *Attorney, Agent, or Firm*—Foley & Lardner LLP

(57) ABSTRACT

A stack structure of carrier boards embedded with semiconductor components and a method for fabricating the same are proposed. A first carrier board and a second carrier board, each of which having at least one through hole, are provided. A first protecting layer and a second protecting layer are formed on a surface of the first and second carrier boards respectively. At least one first semiconductor component and at least one second semiconductor component are disposed on the first and second protecting layers and accommodated in the first and second through holes respectively. A dielectric layer is laminated between the surfaces of the first and second carrier boards without the protecting layers formed thereon. Thus, a modularized package structure with reduced space waste is formed.

3 Claims, 4 Drawing Sheets

US 7,507,915 B2

STACK STRUCTURE OF CARRIER BOARDS EMBEDDED WITH SEMICONDUCTOR COMPONENTS AND METHOD FOR FABRICATING THE SAME

BACKGROUND OF THE INVENTION

1. Field of the Invention

This invention relates to stack structures of carrier boards embedded with semiconductor components and methods for fabricating the same, and more particularly, to a stack structure having the semiconductor components be embedded in the carrier boards and having the carrier boards be stacked on each other, and a method for fabricating the same.

2. Description of Related Art

With the development of electronic technologies, electronic devices are designed to have multiple functions and to be of high performance, so as to satisfy the requirements of high integration and miniaturization of semiconductor packages. A conventional semiconductor package is brought to the market in the form of a multi chip module (MCM). Such a package has a reduced package size and better electrical performances, and is becoming one of the main-streamed products in electronic industry. The package comprises a chip supporting member and at least two semiconductor chips, both of which are installed on the chip supporting member and are stacked on each other. Such a package has been disclosed in U.S. Pat. No. 6,798,049.

FIG. 1 is a cross sectional view of a cavity-down ball grid array (CDBGA) disclosed in U.S. Pat. No. 6,798,049. The CDBGA forms an hole 101 on a circuit board 10 having a circuit layer 11, and the circuit layer 11 on a surface of the circuit board 10 and having an electrical connection pad 11a and a solder wire pad 11b, and accommodating in the hole 101 two stacked semiconductor chips 121 and 122 electrically to each other via a soldering layer 13 (bounding layer). The semiconductor chip 122 is electrically connected via a conductive device 14 such as golden wire to the solder wire pad 11b of the circuit layer 11. A package colloid 15 is formed in the hole 101 of the circuit board 10, and covered on the semiconductor chips 121 and 122 and the conductive device 14. An insulating protecting layer 16 is formed on the circuit layer 11 of the circuit board. A plurality of openings 16a are formed on the insulating protecting layer 16 for the electrical connection pads 11a to be exposed through. The conductive components 17 such as the solder balls are formed in the openings 16 of the insulating protecting layer 16, so as to complete a package process.

However, the stacked semiconductor chips 121 and 122 are electrically connected to the circuit layer 11 in a wire-bonding manner. Such the wire-bonding manner increases the height of the package due to the height of arc wires adopted by the wire-bonding manner. Therefore, the package has a big bulk and is contradictory to an objective of compactness. Moreover, the package has to adopt the soldering layer 13 to electrically connect the semiconductor chips 121 and 122. That is, before the semiconductor chips 121 and 122 being transferred to a package factory for a package process, a stack connection process has to be performed on the semiconductor chips 121 and 122 in a chip factory. Therefore, the process to manufacture the package is quite complicated.

Moreover, in order to have better electric and modularized functionalities, the package has to have more stacked layers, this complicating the circuit layer 11 and increasing a number of the solder wire pads 11b of the circuit layer 11. In order to install more solder wire pads 11b in a limited or constant area, a circuit board for supporting the semiconductor chips 121 and 122 has to have a thin enough circuit layout. However, installing the thin circuit layout on the circuit board has less effect on the reduction of area of the circuit board. Moreover, only a finite number of semiconductor chips 121 and 122 can be stacked on the circuit board, so the package still does not have satisfied electric functionalities.

Therefore, how to increase the density of the multiple-chip modularized package on a multi-layer circuit board and decrease the area occupied by the semiconductor components on the multi-layer circuit board, thereby decreasing the capacity of the semiconductor package, simplifying the semiconductor package process and reducing the manufacture cost, is becoming one of the most important issues in the art.

SUMMARY OF THE INVENTION

In views of the above-mentioned problems of the prior art, it is a primary objective of the present invention to provide a stack structure of carrier boards embedded with semiconductor components and a method for fabricating the same for embedding semiconductor components into carrier boards to form a modularized structure.

It is another objective of the present invention to provide a stack structure of carrier boards embedded with semiconductor components and a method for fabricating the same having a better combination alteration for in accordance with a number of the embedded semiconductor components.

It is a further objective of the present invention to provide a stack structure of carrier boards embedded with semiconductor components and a method for fabricating the same taking the base usage of the space of the carrier boards to minimize the capacity of the modularized structure.

It is still another objective of the present invention to provide a stack structure of carrier boards embedded with semiconductor components and a method for fabricating the same for simplifying a semiconductor process and reducing a manufacture cost.

To achieve the above-mentioned and other objectives, a stack structure of carrier boards embedded with semiconductor components and a method for fabricating the same are provided according to the present invention. The method includes providing a first carrier board and a second carrier board, forming in each of the first and second carrier boards at least one through hole, forming on a surface of the first carrier board a first protecting layer for sealing the through hole of the first carrier board and forming on a surface of the second carrier board a second protecting layer for sealing the through hole of the second carrier board, accommodating a first semiconductor component and a second semiconductor component into the through holes of the first and second carrier boards respectively, the first and second semiconductor components being installed on the first and second protecting layers, laminating a dielectric layer between another surfaces of the first and second carrier boards, both of the another surfaces being surfaces without any protecting layer, to fill part of the dielectric layer in the through holes of the first and second carrier boards to fix the first and second semiconductor components to the through holes, and removing the first and second protecting layers, so as to form a package structure embedded with the first and second semiconductor components.

Each of the first and second carrier boardscan be one selected from the group consisting of an insulating board and a circuit board having a circuit layout. Each of the first and second protecting layerscan be a tape.

The method further includes forming on two surfaces of the package structure a first circuit build-up structure and a second circuit build-up structure, each of which comprises a dielectric layer, a circuit layer stacked on the dielectric layer, and a conductive structure formed in the dielectric layer for electrically connecting the circuit layer to the electrode pads of the first and second semiconductor components. The method further includes forming a plurality of electroplated through holes penetrating the package structure and the first and second circuit build-up structures, wherein the electroplated through holes electrically connect the first and second circuit build-up structures.

According to the above-mentioned method, the stack structure of the present invention includes a first carrier board and a second carrier board, each of the carrier boards having at least one through hole; a first semiconductor component and a second semiconductor component installed in the through holes of the first and second carrier boards respectively; and a dielectric layer formed between the first and second carrier boards and filled in the through holes of the first and second carrier boards for fixing the first and second semiconductor components to the through holes.

The stack structure further includes a first circuit build-up structure and a second circuit build-up structure formed on outermost surfaces of the first and second carrier boards, each of the first and second circuit build-up structures comprising a dielectric layer, a circuit layer stacked on the dielectric layer, and a conductive structure formed in the dielectric layer for electrically connecting the circuit layer to the electrode pads of the semiconductor components. The stack structure further includes a plurality of electroplated through holes penetrating the first and second carrier boards, the first and second circuit build-up structures and the dielectric layer, wherein the electroplated through holes electrically connect the circuit layers of the first and second circuit build-up structures.

In contrast to the prior art, the present invention embeds the semiconductor components in the carrier boards, forming protecting layers on surfaces of the carrier boards and on active surfaces of the semiconductor components, and laminating a dielectric layer between another surfaces of the carrier boards, both of the another surfaces are surfaces without any protecting layer, so as to form a modularized structure, which takes the best usage of the space of the carrier boards and has a small capacity. Moreover, the modularized structure can have different combination and alteration in accordance with varieties of demands. Compared with the prior art, the stack structure of carrier boards embedded with semiconductor components and the method for fabricating the same has the capability to simplify a semiconductor package process and reduce the manufacture cost. Moreover, the present invention further forms on surfaces of the carrier boards the first and the second circuit build-up structure and a plurality of electroplated through holes for electrically connecting the first and second circuit build-up structures, so as to form a stack structure of carrier boards embedded with semiconductor components. The stack structure can be electrically connected to other conductive components or external electronic devices such as a printed circuit board.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIG. 2A through FIG. 2F are used to illustrate collectively a stack structure of carrier boards embedded with semiconductor components and a method for fabricating the same.

Figure 1:
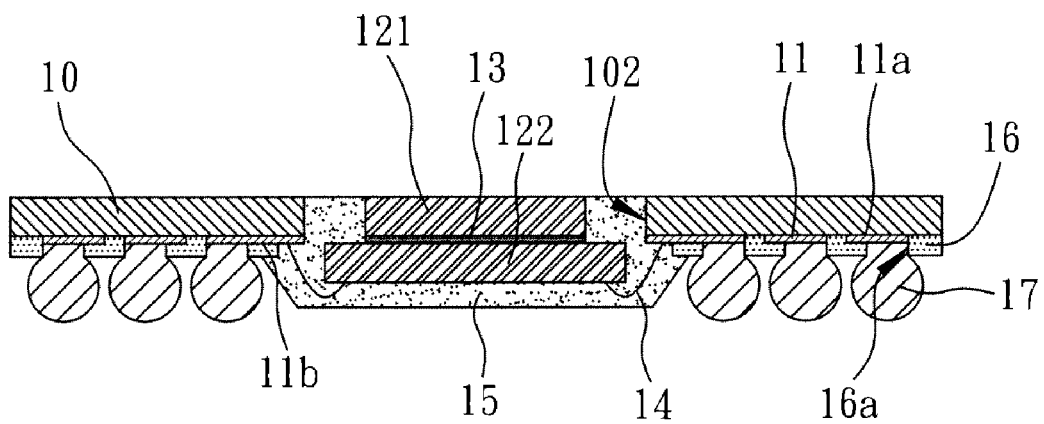
FIG. 1 is a cross sectional view of a cavity-down ball grid array (CDBGA) disclosed in U.S. Pat. No. 6,798,049.
Figure 2A:
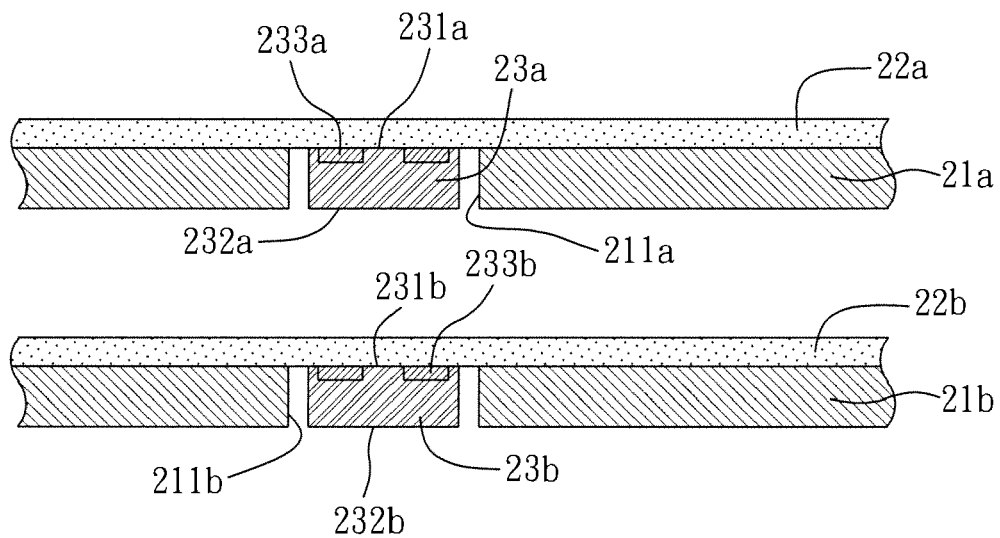
FIG. 2A to FIG. 2F are six cross sectional views of a stack structure of carrier boards embedded with semiconductor components of the preferred embodiment according to the present invention.

Please refer to FIG. 2A. The method forms a first through hole 211a in a first carrier board 21a, a second though hole 211b in a second carrier board 21b, a first protecting layer 22a on a surface of the first carrier board 21a for sealing one end of the first through hole 211a, a second protecting layer 22b on a surface of the second carrier board 21b for sealing one end of the second through hole 211b, accommodating in the first through hole 211a and installing on the first protecting layer 22a a first semiconductor component 23a, and accommodating in the second through hole 211b and installing on the second protecting layer 22b a second semiconductor component 23b.

The first carrier board 21a, and the second carrier board 21b as well, is an insulating board or a circuit board having a circuit layout. The first protecting layer 22a, and the second protecting layer 22b as well, is a tape. The tape is used to adhere the first semiconductor component 23a (the second semiconductor component 23b) to the first through hole 211a of the first carrier board 21a (the second through hole 211b of the second carrier board 21b). The first semiconductor component 23a comprises an active surface 231a has a plurality of electrode pads 233a, an inactive surface 232a opposite to the active surface 231a, and is installed on the first protecting layer 22a with the active surface 231a. The first protecting layer 22a is used to protect the active surface 231a of the first semiconductor component 23a during a compression process, which will be described in the following paragraphs. The second semiconductor component 23b comprises an active surface 231b has a plurality of electrode pads 233b, an inactive surface 232b opposite to the active surface 231b, and is installed on the second protecting layer 22b with the active surface 231b. The second protecting layer 22b is used to protect the active surface 231b of the second semiconductor component 23b during the compression process.

Figure 2B:
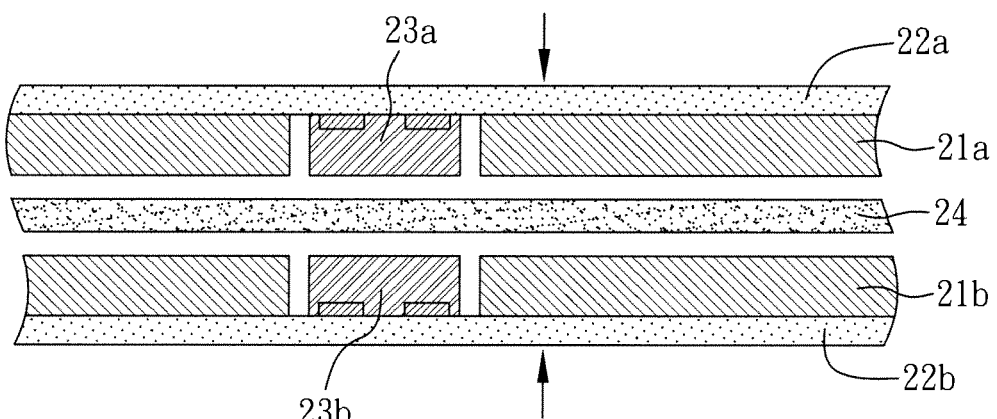
Figure 2C:
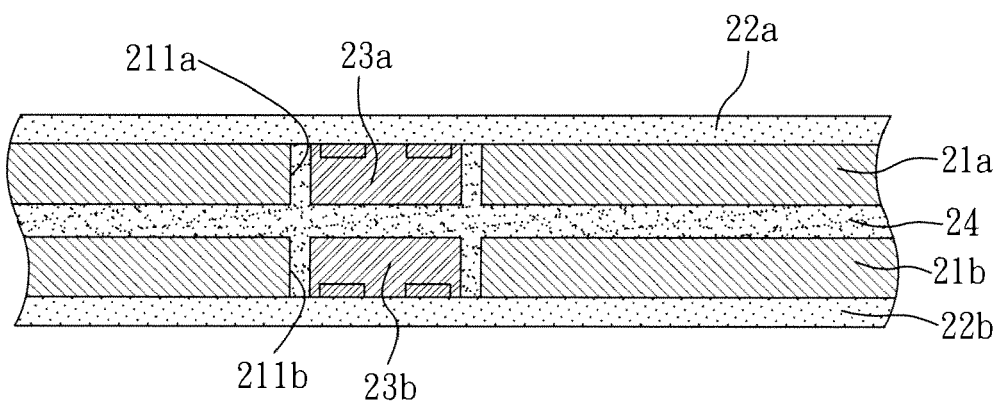

Please refer to FIG. 2B. Another surface of the first carrier board 21a and another surface of the second carrier board 21b, both of the another surfaces being a surface without any protecting layers, are compressed toward directions indicated by two arrows to form a dielectric layer 24, so as to form a structure shown in FIG. 2C. In FIG. 2C, part of the dielectric layer 24 is filled in the through holes 211a and 211b, and the first and second semiconductor components 23a and 23b are fixed to the through holes 211a and 211b respectively.

Figure 2D:
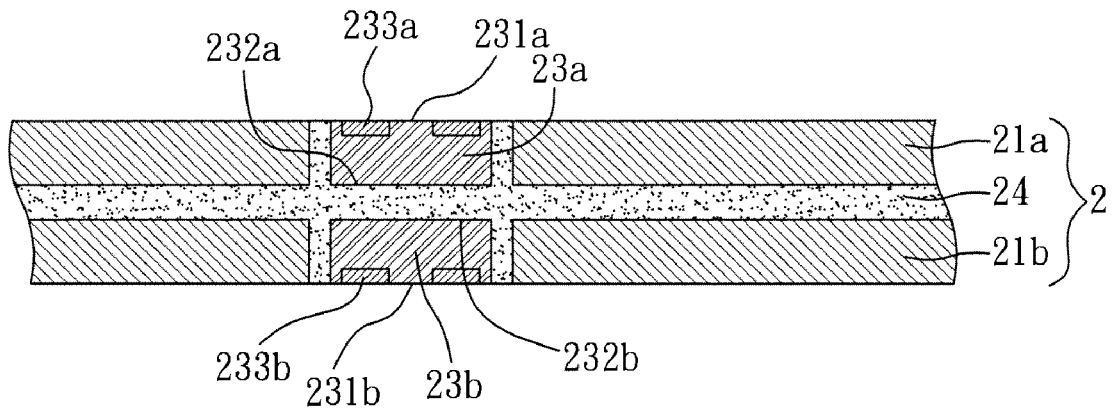

Please refer to FIG. 2D. Both of the first and second protecting layers 22a and 22b are removed, so as to form a package structure 2 embedded with the first and second semiconductor components 23a and 23b.

Figure 2E:
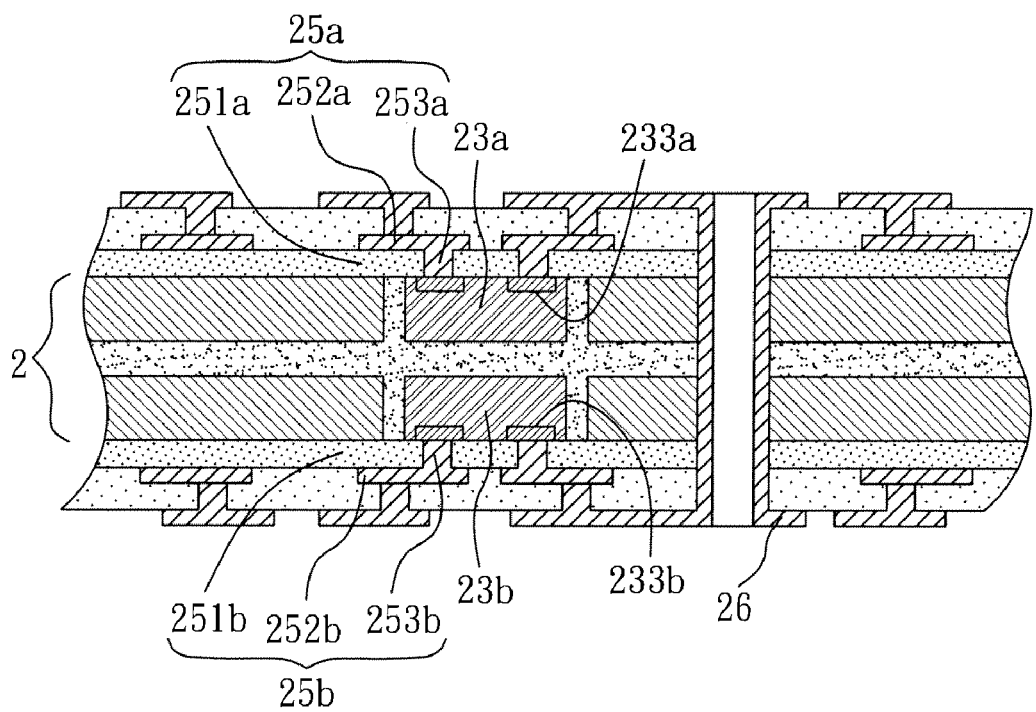

Please refer to FIG. 2E. A first circuit build-up structure 25a and a second circuit build-up structure 25b are formed on two surfaces of the package structure 2 respectively. The first circuit build-up structure 25a comprises a dielectric layer 251a, a circuit layer 252a stacked on the dielectric layer 251a, and a conductive structure 253a formed in the dielectric layer 251a for the circuit layer 252a to be electrically connected to the electrode pads 233a of the first semiconductor component 23a. The second circuit build-up structure 25b comprises a dielectric layer 251b, a circuit layer 252b stacked on the dielectric layer 251b, and a conductive structure 253b formed in the dielectric layer 251b for the circuit layer 252b to be electrically connected to the electrode pads 233b of the second semiconductor component 23b. A plurality of electroplated through hole (PTH) 26 are formed to penetrate the package structure 2, the first circuit build-up structure 25a and the second circuit build-up structure 25b, to electrically connect the circuit layers circuit layer 252a and 252b.

Moreover, it should be noted that the first circuit build-up structure 25a, and the second circuit build-up structure 25b as well, is allowed to comprise more than one layer, unlike that shown in figure, to satisfy the practical demands.

Figure 2F:
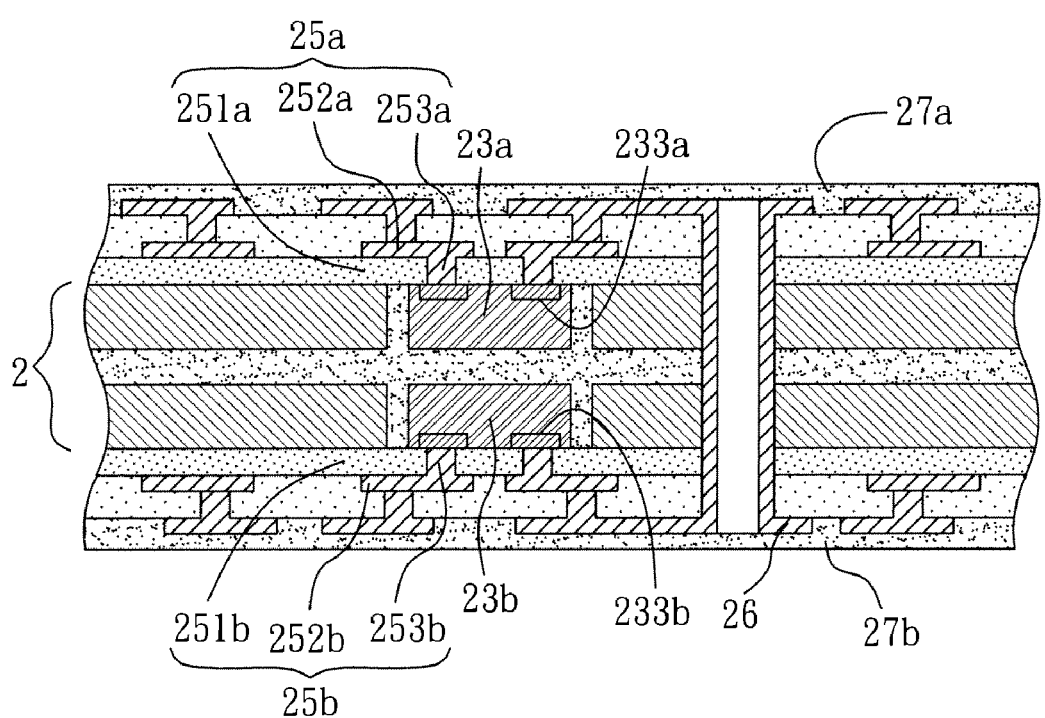

Please refer to FIG. 2F. A first solder mask layer 27a is formed on an outermost surface of the first circuit build-up structure 25a, and a second solder mask layer 27b is formed in an outermost surface of the second circuit build-up structure 25b.

According to the method described previously, a stack structure of carrier boards embedded with semiconductor components is shown in FIG. 2C and FIG. 2D. The stack structure comprises a first carrier board 21a and a second carrier board 21b. Two through holes 211a and 211b are formed in the first and second carrier boards 21a and 21b respectively. The first semiconductor component 23a and the second semiconductor component 23b are accommodated in the through holes 211a and 211b of the first and second carrier boards 21a and 21b respectively. The first and second semiconductor components 23a and 23b have the active surfaces 231a and 231b having the electrode pads 233a and 233b respectively, and the inactive surfaces 232a and 232b, which are opposite to the active surfaces 231a and 231b respectively. The stack structure further comprises the dielectric layer 24, which is laminated between the first carrier board 21a and the second carrier board 21b and filled in the through holes 211a and 211b of the first and second carrier boards 21a and 21b for fixing the first and second semiconductor components 23a and 23b to the through holes 211a and 211b respectively.

The above-mentioned stack structure, as shown in FIG. 2E, further comprises the first circuit build-up structure 25a and the second circuit build-up structure 25b formed on the outermost surfaces of the first and second carrier board 21a and 21b respectively. The first and second circuit build-up structure 25a and 25b comprises the dielectric layers 251a and 251b, the circuit layers 252a and 252b stacked on the dielectric layers 251a and 251b respectively, and the conductive structures 253a and 253b formed in the dielectric layers 251a and 251b respectively for the circuit layers 252a and 252b to be electrically connected to the electrode pads 233a and 233b of the first and second semiconductor components 23a and 23b respectively. The stack structure further comprises the electroplated through holes 26 penetrating the first and second carrier boards 21a and 21b, the first and second circuit build-up structures 25a and 25b and the dielectric layers 24, and electrically connected to the circuit layers 252a and 252b.

Additionally, as shown in FIG. 2F, the stack structure further comprises the first and second solder mask layers 27a and 27b formed on the outermost surfaces of the first and second circuit build-up structures 25a and 25b.

In contrast to the prior art, the present invention embeds a plurality of semiconductor components in the first and second carrier boards 21a and 21b, so as to increase a number of carrier boards on which the semiconductor components are installed, and increase the storage capacity. Moreover, the first and second semiconductor components 23a and 23b are pre-installed in the through holes 211a and 211b of the first and second carrier boards 21a and 21b. Further, the first and second protecting layers 22a and 22b are formed on the surfaces of the first and second carrier board 21a and 21b and the active surfaces of the first and second semiconductor component 23a and 23b, and the first carrier board 21a is stacked on the second carrier board 21b, so as to form a modularized structure, which takes the best usage of the space of the carrier boards and has a small capacity. Moreover, the modularized structure can have different combination and alteration in accordance with varieties of demands. Compared with the prior art, the stack structure of carrier boards embedded with semiconductor components and the method for fabricating the same has the capability to simplify a semiconductor package process and reduce the manufacture cost.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A stack structure of carrier boards embedded with semiconductor components, the stack structure comprising:
   a first carrier board and a second carrier board, each of the carrier boards having at least one through hole;
   a first semiconductor component and a second semiconductor component installed in the through holes of the first and second carrier boards respectively, wherein each of the first and second semiconductor components has an active surface and an opposing non-active surface, the active surface having a plurality of electrode pads;
   a dielectric layer formed between the first and second carrier boards and filled in the through holes of the first and second carrier boards for fixing the first and second semiconductor components to the through holes;

a first circuit build-up structure and a second circuit build-up structure formed on outermost surfaces of the first and second carrier boards respectively, each of the first and second circuit build-up structures comprising a dielectric layer, a circuit layer stacked on the dielectric layer, and a conductive structure formed in the dielectric layer for electrically connecting the circuit layer to the electrode pads of the semiconductor components; and a plurality of electroplated through holes penetrating the first and second carrier boards, the first and second circuit build-up structures and the dielectric layer, wherein the electroplated through holes electrically connect the circuit layers of the first and second circuit build-up structures.

2. The stack structure of claim 1, wherein each of the first and second carrier boards is one selected from the group consisting of an insulating board and a circuit board having a circuit layout.

3. The stack structure of claim 1 further comprising a first solder mask layer and a second solder mask layer formed on outermost surfaces of the first and second circuit build-up structures respectively.

* * * * *